United States Patent [19]

Lester et al.

[11] Patent Number: 5,084,691
[45] Date of Patent: Jan. 28, 1992

[54] CONTROLLABLE FUSE

[75] Inventors: Theodore V. Lester, Schiller Park; Jerry D. Meyerhoff, Buffalo Grove; Loren E. Saar, Elmwood Park, all of Ill.

[73] Assignee: Motorola, Inc., Schaumburg, Ill.

[21] Appl. No.: 590,732

[22] Filed: Oct. 1, 1990

[51] Int. Cl.$^5$ ............................................. H01H 85/04
[52] U.S. Cl. ..................... 337/297; 337/166; 337/232
[58] Field of Search ................ 337/297, 232, 166, 404

[56] References Cited

U.S. PATENT DOCUMENTS

| | | | |
|---|---|---|---|
| 3,763,454 | 10/1973 | Zandonatti | 337/404 |
| 3,978,443 | 8/1976 | Dennis et al. | 337/297 |
| 4,031,497 | 6/1977 | Ozawa | 337/297 |
| 4,053,861 | 10/1977 | Knapp, Jr. | 337/297 |
| 4,208,645 | 6/1980 | Harmon | 337/297 |
| 4,494,104 | 1/1985 | Holmes | 337/297 |

Primary Examiner—Harold Broome
Attorney, Agent, or Firm—Phillip H. Melamed

[57] ABSTRACT

A controllable fuse (10; 40; 50; 60; 80) has a pair of isolated conductor pads (26, 27), a solder connection (32; 41; 51) connected to the pads and providing a circuit connection therebetween, and at least one heater (14; 70, 75) to produce heat in response to an electrical signal. When sufficient heat is provided, the solder connection will desolder and disconnect the circuit connection between the conductor pads (26, 27). Major features are that the conductor pads and the heater are provided on a planar surface(s) (19, 25) as planar films and that redundancy for the fuse can be implemented by providing more than one heater (70, 75). A preferred manufacturing method for the fuse is disclosed which utilizes a solder retaining structure. Several fuse configurations are illustrated.

18 Claims, 1 Drawing Sheet

CONTROLLABLE FUSE

FIELD OF THE INVENTION

The present invention relates to the field of controllable fuses, and in particular to the field of controllable fuses in which heat provided by a heater element is used to interrupt a circuit connection when an electrical signal is applied to the heater element.

BACKGROUND OF THE INVENTION

Controllable fuses which utilize a heater element are known. In such fuses when an electrical signal is applied to the heater element sufficient heat is developed to result in interrupting a circuit connection between circuit terminals which are separate from the heater element. One such device is manufactured by Therm-O-Disc of Mansfield, Ohio, U.S.A. This device appears to utilize a soldered connection between two primary terminals wherein a spring will open this soldered connection upon the solder reaching a molten state. A separate heater coil is then wound around an insulating sleeve that surrounds the solder connection. Upon application of an external electrical signal to the heater coil, sufficient heat is provided such that the solder reaches a molten state and the spring then results in providing an open circuit between the two primary terminals. This type of fuse is typically a nonresettable fuse. Such fuses are utilized in various "fail-safe" applications such as an anti-lock brake system (ABS). In case of a failure such a fuse will provide an open circuit which results in a vehicle reverting to conventional, as opposed to anti-lock, braking control.

Fuses such as the Therm-O-Disc device described above, typically utilize a large number of parts and do not lend themselves to low cost production techniques. Also, in such devices, the heater coil must be wound around the insulating sleeve and the thermal coupling provided by this insulating sleeve may not be consistently reproduced resulting in variable performance or response times for the resultant fuse. Also, typically such fuses do not have any redundancy structure so if the heater fails or if the wrong signal is provided to the heater, the fuse fails to operate properly.

OBJECTS OF THE INVENTION

An object of the present invention is to provide an improved controllable fuse which overcomes at least some of the deficiencies of the prior controllable fuses described above.

BRIEF DESCRIPTION OF THE DRAWINGS

For a more complete understanding of the present invention reference should be made to the drawings in which.

DESCRIPTION OF THE PREFERRED EMBODIMENTS

Figure 1:
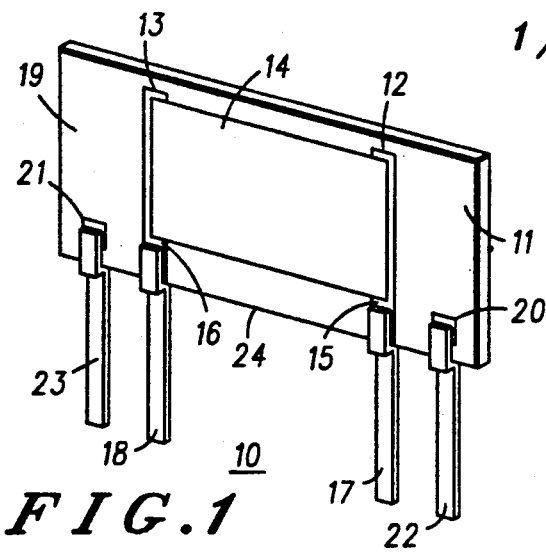
FIG. 1 is a perspective view of a reverse side of a controllable fuse.

Referring to FIG. 1, the reverse side of a controllable fuse 10 is illustrated. The fuse 10 includes a thermally conductive, electrically insulating ceramic substrate 11 on which a thick film resistive ink has been applied between conductors 12 and 13, provided as conductive inks on the substrate 11, so as to implement a thick film resistor 14 therebetween. Conductor lead terminal pad areas 15 and 16 are provided as extensions of the conductors 12 and 13, respectively. External leads 17 and 18 are soldered to the conductor pad areas and extend away from the substrate 11 in a downward direction. The substrate 11 typically comprises a 0.025 inch thick alumina plate having a planar reverse side surface 19 on which the conductors 12 and 13 and the thick film resistor 14 are deposited. In addition, conductor pad areas 20 and 21 are also provided on the reverse side surface 19 and leads 22 and 23 are soldered thereto, respectively. The preferred configuration for the leads 17, 18, 22 and 23 is such that each lead has a U-shaped portion which abuts a bottom edge 24 of the substrate 11. Each lead has an extending lead portion which extends away from the bottom edge 24 and substrate 11 such that all the leads extend away in the same direction and the fuse 10 is a single in-line leaded device. However, clearly other types of configurations for the lead orientation can be implemented.

Figure 2:
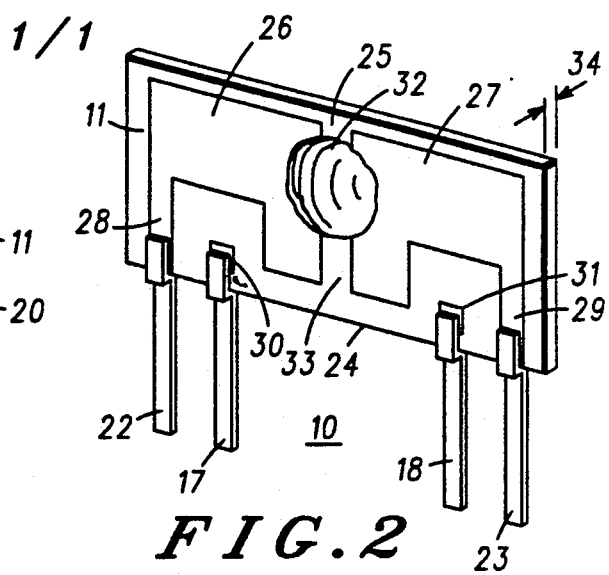
FIG. 2 is a perspective front side view of a controllable fuse having a reverse side as shown in FIG. 1.

Referring now to FIG. 2, a preferred configuration for the front side of the substrate 11 is illustrated with any identical components shown in both FIGS. 1 and 2 being identified by identical corresponding reference numerals. In FIG. 2, the substrate 11 has a planar front surface 25 on which a pair of adjacent conductor pads 26 and 27 are provided as thick film conductor inks. Conductor lead terminal pads 28 and 29 extend from the conductor pads 26 and 27, respectively, and are soldered to the leads 22 and 23, respectively. In addition, electrically isolated conductor pads 30 and 31, comprising thick film conductor inks fired onto the top surface 25, are also illustrated and are soldered to the leads 17 and 18, respectively.

A solder mass 32, in the form of a solder ball, is electrically and physically directly connected to the pads 26 and 27. The solder mass 32 bridges a 0.070 inch gap 33 between the conductor pads 26 and 27 and provides a circuit connection between pads 26 and 27 comprising a direct short circuit. The solder mass 32 is in direct physical contact with portions of each of the conductor pads 26 and 27, but the solder mass does not extend over the entire surface of the conductor pads 26 and 27 even though the surface of these pads, as shown in FIG. 2, will readily accept solder. This configuration is preferably achieved by the method of first applying a solder retaining structure, in the form of a screened mask layer of resist or a preformed annular ring 27A (shown in phantom in FIG. 2), to the structure shown in FIG. 2 absent the solder mass 32. Then solder is applied, via screening solder paste through a stencil mask or use of a solder preform, within a solder retaining area defined by the solder retaining structure. Then electrical connection between the pads 26 and 27 is achieved by allowing the solder to attain a molten state for a short duration. Subsequently, the assembly is cooled and then the solder retaining structure is removed so as to achieve the structure shown in FIG. 2. The operation of the controllable fuse 10 shown in FIGS. 1 and 2 will now be discussed in detail.

The controllable fuse 10, as noted above, has a pair of originally electrically isolated conductor pads 26 and 27, wherein these pads are advantageously formed as planar conductor film metalizations on the planar front surface 25 of the thermally conductive substrate 11. The thick film heating resistor 14 formed on the reverse planar surface 19 is also formed as a substantially planar film. A thickness dimension 34 of the substrate 11 determines the distance between the heater resistor 14 and the solder mass 32 wherein this dimension also determines the degree of thermal conduction between these elements. In response to the application of an external electrical signal to the leads 17 and 18, the resistor 14 will produce sufficient heat such that the solder mass 32 will attain a molten state. This will result in the desoldering of the solder connection between the pads 26 and 27 and thereby the disconnection of the short circuit connection between these two pads. This occurs because preferably all of the exposed area of the conductor pads 26 and 27 will readily accept solder such that when the solder mass 32 becomes molten, a wicking action will occur that will overcome the surface tension of the solder mass 32 and result in providing the withdrawal of the solder mass away from the channel separation area 33. This action may also occur because preferably the solder mass 32 is a nonsilver containing solder and the conductor pads 26 and 27 may be made out of a substantially silver, rather than paladium silver, thick film metalization. In such a case, having the solder mass 32 molten for a predetermined time will result in dissolving (leaching) silver portions of the pads 26 and 27, increasing the gap 33, and this results in an open circuit between pads 26 and 17. However, even the use of paladium silver metalizations for pads 26 and 27 and the use of a 2% silver solder composition for the solder mass 32 will function satisfactorily even though these materials will resist having the solder mass dissolve the pads 26 and 27.

In essence, when an electrical signal is applied to the leads 17 and 18, the heat from the resistor 14 will render the solder mass molten and this results in desoldering the solder connection between the pads 26 and 27 and creating an open circuit therebetween. Thus now the previous short circuit connection between the leads 22 and 23 has been opened up and the end result is a controllable circuit breaker or thermal cutoff fuse for circuitry connected to leads 22 and 23. The fuse 10 can be readily manufacturer by using thick film circuit manufacturing techniques involving screen printing and firing manufacturing methods. No coil winding manufacturing techniques are required. Also, using screen printing techniques allows manufacturing many fuses at the same time by using prescored substrates and simultaneously printing metalizations for many fuses on one prescored substrate. In addition, a much more reliable thermal conduction between the heating element and the solder mass is achieved by this configuration rather than relying on winding a coil on a thermally conductive sleeve that is wrapped around a solder connection which is to be rendered molten. In the present case, a known, predictable and consistent thermal conduction is achieved which depends upon the thermal conductivity characteristics of the substrate 11 and its thickness dimension 34. If desired, the fuse 10 shown in FIGS. 1 and 2 can be encapsulated by a flexible high temperature coating material which will allow the solder mass 32 to wick away from the channel 33 when it is molten. Alternatively, the substrate 11 can be inserted into a plastic housing for protection of the components of the fuse 11.

While the fuse configuration shown in FIGS. 1 and 2 is the preferable configuration, other configurations are possible. One alternative configuration which is not shown, is having both the heater resistor 14 and the conductor pads 26 and 27 on the same planar surface 25 of the substrate 11 rather than on surfaces, such as surfaces 25 and 19, which are parallel to one another. Such a single sided configuration would function in essentially the same manner and heat from the resistor would still be conducted through the substrate to the solder mass.

Figure 3:
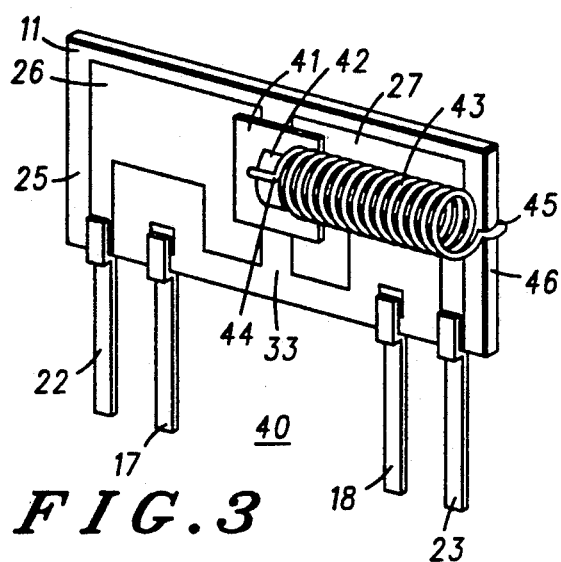
FIG. 3 is a perspective view of another embodiment for the front side of a controllable fuse.

FIG. 3 illustrates an alternative configuration for the front side of a fuse 40 which has the same reverse side configuration as shown in FIG. 1. All elements in FIG. 3 which directly correspond to identical elements shown in FIG. 2 for the fuse 10 have been identified by identical corresponding reference numerals. In FIG. 3, the solder mass 32 has now been replaced by a thin metal bridging pad 41 which is directly soldered to portions of the conductor pads 26 and 27. The pad 41 forms a short circuit between pads 26 and 27 bridging the channel 33. The pad 41 comprises a sheet metal pad of solderable electrically conductive material which has an upstanding projection 42 of any desirable shape. After the pad 41 has been soldered, a spring 43 is then assembled such that one end 44 of the spring is attached to the projection 42 and another end 5 of the spring is attached to an edge 46 of the substrate 11 such that the spring is in tension. Now, when the heater resistor 14 applies heat to the solder connections between the pad 41 and the conductor pads 26 and 27, when these connections are rendered molten, the spring 43 will result in providing an open circuit between the conductor pads 26 and 27 by moving the pad 41. Implementing this spring action in conjunction with the planar implementation for the conductor pads 26 and 27 and the planar implementation of the heater resistor element 14 is believed to render the fuse 40 more manufacturable than other prior fuses which depend on winding a heater coil around a solder connection.

Figure 4:
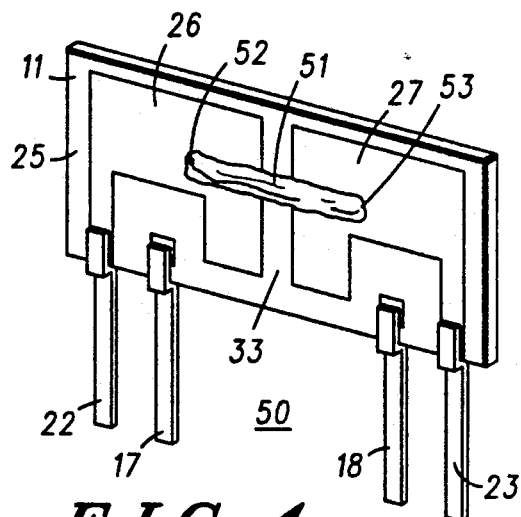
FIG. 4 is a perspective view of another embodiment for the front side of a controllable fuse.

Referring to FIG. 4, an additional alternative embodiment for the front side of a controllable fuse 50 is shown wherein the fuse 50 utilizes the same reverse side configuration as shown in FIG. 1. Again, components shown in FIG. 4 which are identical to the components shown in FIG. 2 are identified by identical reference numerals. In FIG. 4, the solder mass 32 in FIG. 2 has now been replaced by a solderable and/or meltable electrically conductive bar 51 which has at least end portions 52 and 53 soldered to the conductor pads 26 and 27, respectively. When sufficient heat is applied via the heating of the resistor 14, the bar 51 will melt or be rendered molten and this will result in providing an open circuit between the conductor pads 26 and 27. The bar 51, as was the case with the solder mass 32, can be applied either by the use of a solder mask structure and then the screening and subsequent heating of solder paste applied through a stencil followed by the removal of the mask structure, or a solder preform can be utilized. For the fuse 50, if a solder preform is utilized, no solder masking structure may be necessary since just the ends of the solder preform 52 and 53 have to be soldered to or welded to the conductor pads 26 and 27.

Figure 5:
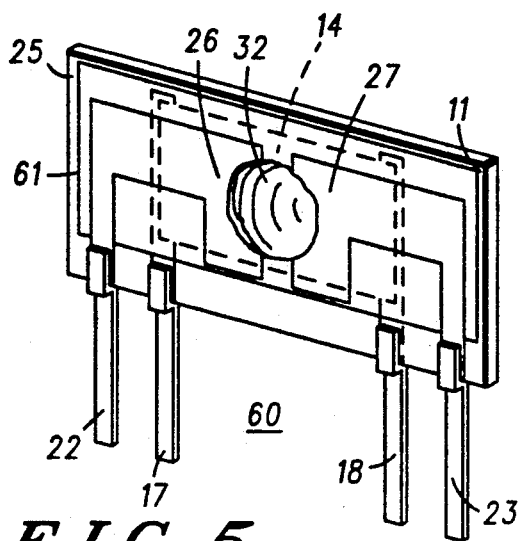
FIG. 5 is a perspective front side view of an alternative embodiment for a controllable fuse.

Referring to FIG. 5, an alternative configuration for a fuse 60 is shown in which essentially all of the thick film metalizations shown in FIGS. 1 and 2 are now contained on one side of a fuse substrate. Identical reference numerals are utilized to identify components in FIG. 5 which directly correspond to the components illustrated in FIGS. 1 and 2. Basically, in FIG. 5, the thick film resistor 14 is now directly applied to the planar front surface 25 of the substrate 11 along with its associated conductors 12 and 13. Now, a layer or film 61 of dielectric electrically insulating, but thermally conducting, material is applied over the heating resistor 14. The film 61 is preferably a thick film ink. Subsequently, the conductor pads 26 and 27 and the solder mass 32 are applied on top of the electrically insulating film 61. For such a configuration lower firing temperature inks will probably be used for the thick film inks which are applied on top of the resistor 14 so as not to drastically change the resistance of this resistor after it is initially fired using thick film manufacturing processes. The fuse 60 has the advantage of being a fuse which is manufactured on just one side of the ceramic substrate 11. When sufficient heat is generated by the resistor 14, this heat will be conducted through the electrically insulating film 61 to the solder mass 32 and the fuse 60 will function in the same manner as the fuse 10 in FIGS. 1 and 2.

Figure 6:
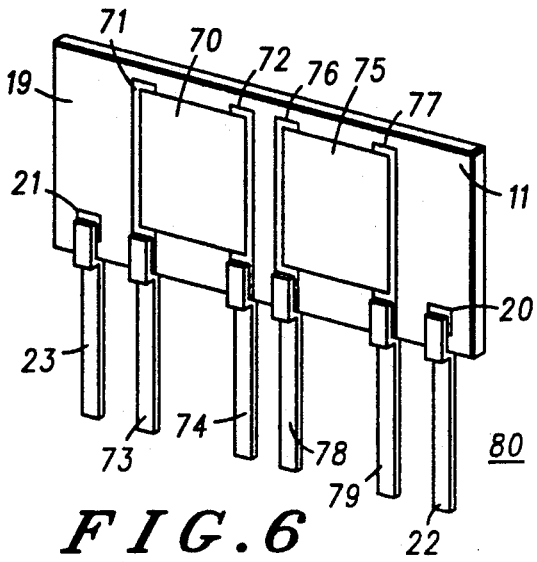
FIG. 6 is a perspective view of an alternative embodiment for the reverse side of a controllable fuse.

Referring to FIG. 6, an alternative configuration for the reverse side of the fuse 10 is illustrated. In FIG. 6, identical reference numerals are utilized to identify identical components and structure which appear in both FIGS. 6 and 1. In FIG. 6, instead of having single heater resistor 14, now two different heater resistors, each independently controllable, are provided on the reverse planar surface 19 of the substrate 11. Thus a first resistor 70 is provided on surface 19 along with its associated conductors 71 and 72 that connect to external leads 73 and 74 which receive an externally applied electrical signal. In addition, a second heater resistor 75 is provided on surface 19 with its associated conductors 76 and 77 that are connected to associated leads 78 and 79. The resistors 70 and 75 are formed as planar thick film resistors and the conductors 71, 72, 76 and 77 are formed as planar thick film conductors. The combination of the reverse side configuration shown in FIG. 6 with the front side configuration shown in FIG. 2 results in a controllable fuse 80 which has built-in redundancy characteristics wherein these characteristics depend on the type of redundancy which is desired.

For the controllable fuse 80 it may be desired that only if external electrical signals are applied to both the heater resistors 70 and 75 will sufficient heat be generated so as to render the solder mass 32 in a molten state and thereby disconnect the conductor pads 26 and 27. Thus the fuse 80 can be constructed such that only if separate electrical signals are simultaneously applied to each of the resistors 70 and 75 will the controllable fuse 80 result in opening the connection between the conductor pads 26 and 27. This type of redundancy may be desired in some instances. Alternatively, it may be desired that the controllable fuse should produce an open circuit if either one of the resistors 70 or 75 receives an electrical signal. In such a case, applying an electrical signal to any one of the resistors 70 or 75 will produce sufficient heat to render the solder mass 32 molten and thereby create an open circuit between the conductor pads 26 and 27. Thus in the first situation, the heat from any one of the resistors 70 and 75 will be insufficient to desolder or render the solder mass 32 molten, whereas in the latter situation an electrical signal applied to either of the resistors 70 or 75 will produce a sufficient amount of heat. The amount of heat provided by the resistors in fuse 80 can be determined by appropriate choice of the resistance implemented by the resistors 70 or 75 and/or by the determination of the magnitude of the electrical signal applied to each of these resistors, or by a combination of both of these parameters.

Prior controllable fuses have generally not provided for either type of redundancy discussed above since at most they appear to use a single heater resistor. The use of two heater resistors, each of which receives a different external electrical excitation signal, could be applied even to the prior art type of coil wound implementation of heater resistor fuses to achieve the above noted redundancy features.

While we have shown and described specific embodiments of this invention, further modifications and improvements will occur to those skilled in the art. All such modifications which retain the basic underlying principles disclosed and claimed herein are within the scope of this invention.

What is claimed is:

1. A controllable fuse comprising:
 a) a pair of electrically isolated conductor pads;
 b) at least one solder connection electrically connecting said conductor pads and creating a circuit connection therebetween;
 c) at least one heater element means producing heat in response to the application of an external electrical signal to said heater element means; and
 d) an electrically insulating but thermally conducting material provided between said heater element means and said conductor pads, said insulating material to said solder connection such that upon application of said external electrical signal to said heater element means sufficient heat is generated to desolder said solder connection and thereby disconnect said circuit connection between said conductor pads;

wherein the improvement comprises said conductor pads being provided on a planar surface and said heater element means being provided as a substantially planar film on a planar surface with said insulating material being provided between said heater element means and said conductor pads, and wherein said solder connection includes a solder mass physically and electrically bridging and soldered to said pair of conductor pads which are position adjacent one another and separated by a gap, and wherein the configuration and structure of said conductor pads and said solder mass is such that said solder mass, when molten, overcomes surface tension of said solder mass and said solder mass withdraws from said gap thereby disconnecting the circuit connection between the conductor pads created by said solder mass.

2. A controllable fuse according to claim 1 wherein said conductor pads are provided on a first planar surface and said heater element means is provided on a second planar surface separate from and parallel to said first planar surface with said insulating layer provided therebetween.

3. A controllable fuse according to claim 2 wherein said planar heater element means comprises a resistive film.

4. A controllable fuse according to claim 3 which includes a substrate having at least one of said heater element means and said pair of conductor pads deposited on a first surface of said substrate.

5. A controllable fuse according to claim 4 wherein the other one of said heater element means and said conductor pads is deposited on a second opposite side surface of said substrate with the thickness of said substrate therefore determining the distance between said heater element means and said conductor pads.

6. A controllable fuse according to claim 4 wherein said substrate comprises a rigid ceramic plate.

7. A controllable fuse comprising:
  a) a pair of electrically isolated conductor pads;
  b) at least one solder connection electrically connecting said conductor pads and creating a circuit connection therebetween;
  c) at least one heater element means producing heat in response to the application of an external electrical signal to said heater element means; and
  d) an electrically insulating but thermally conducting material provided between said heater element means and said conductor pads, said heater element means thermally conductively coupled through said insulating material t said solder connection such that upon application of said external electrical signal to said heater element means sufficient heat is generated to desolder said solder connection and thereby disconnect said circuit connection between said conductor pads;
  wherein the improvement comprises said conductor pads being provided on a planar surface and said heater element means being provided as a substantially planar film on a planar surface with said insulating material being provided between said heater element means and said conductor pads.
  said fuse including a substrate having at least one of said heater element means and said pair of conductor pads deposited on a first surface of said substrate, and wherein said insulating material comprises a deposited film of electrically insulating dielectric material separating and deposited between said planar heating element means and said conductor pads, with one of said heating element means and said pair of conductor pads deposited on said insulating film.

8. A controllable fuse according to claim 4 wherein said solder connection is coupled to one end of a spring means having another end connected to said substrate wherein during application of said external electrical signal said solder connection will become desoldered from its associated conductor pad and action of said spring means will then result in removal of said circuit connection.

9. A controllable fuse according to claim 1 wherein said solder mass is in the form of a solder ball physically and electrically bridging said pair of conductor pads which are position adjacent one another.

10. A controllable fuse according to claim 1 wherein each of said conductor pads includes a portion in contact with said solder mass and a surrounding portion which will readily accept solder when said solder mass achieves a molten state and create a wicking action to implement the overcoming of the surface tension of said solder mass and the withdrawal of said solder mass from said gap resulting in disconnecting the circuit connection between the conductor pads created by said solder mass.

11. A controllable fuse according to claim 4 wherein at least one of said conductor pads comprises a material having a substantial silver content and wherein said solder connection to said one pad, when said solder is in a molten state, will leach the silver in said pad, whereby said circuit connection will be disconnected.

12. A controllable fuse according to claim 4 wherein said planar heater element means has opposite end portions to which leads are attached.

13. A controllable fuse according to claim 12 wherein leads are connected to each of said of pair of conductor pads.

14. A controllable fuse according to claim 13 wherein extending portions of said leads generally extend in the same direction away from said substrate.

15. A method for manufacturing a controllable fuse comprising:
  a) a pair of electrically isolated conductor pads;
  b) at least one solder connection electrically connecting said conductor pads and creating a circuit connection therebetween;
  c) at least one heater element means producing heat in response to the application of an external electrical signal to said heater element; and
  d) an electrically insulating but thermally conducting layer of material provided between said heater element means and said conductor pads, said heater element means thermally conducting layer to said solder connection such that upon application of said external electrical signal to said heater element means sufficient heat is generated to desolder said solder connection and thereby disconnect said circuit connection between said conductor pads;
  wherein said method comprises the steps of:
  1) depositing said conductor pads on a planar surface, and
  2) depositing said heater element means as a planar film on said thermally conducting layer, said method also including the steps of providing said solder connection between said pads by (a) providing a solder retaining area defined by an applied solder retaining structure which surrounds said solder retaining area, said solder retaining area emcompassing a portion of at lest each of said conductor pads, (b) applying solder within said solder retaining area so as to bridge said conductor pads by a solder connection comprising a solder mass physically and electrically bridging and soldered to said conductor pads, and (c) subsequently removing said solder retaining structure.

16. A method according to claim 15 wherein said solder retaining structure has an annular shape and wherein said pads, heater element means and solder retaining structure are applied on at least one side of a substrate.

17. A controllable fuse comprising:
  a) a pair of electrically isolated conductor pads;
  b) at least one solder connection electrically connecting said conductor pads and creating a circuit connection therebetween;
  c) at least one heater element means producing heat in response to the application of an external electrical signal to said heater element means; and
  d) an electrically insulating but thermally conducting material providing between said heater element means and said conductor pads, said heater element means thermally conductively coupled through said insulating material to said solder connection such that upon application of said external electrical signal to said heater element means sufficient heat is generated to desolder said solder connection and thereby disconnect said circuit connection between said conductor pads;

wherein the improvement comprises said heater element means comprises two separate heater elements each receiving its own associated separate and independent external electrical signal and each generating heat in response thereto which is coupled through said material to said solder connection, wherein in response to either one of said external electrical signals being applied to its associated heater element said heater element provides sufficient heat to disconnect said circuit connection.

18. A controllable fuse comprising:
a) a pair of electrically isolated conductor pads;
b) at least one solder connection electrically connecting said conductor pads and creating a circuit connection therebetween;
c) at least one heater element means producing heat in response to the application of an external electrical signal to said heater element means; and
d) an electrically insulating but thermally conducting material provided between said heater element means and said conductor pads, said heater element means thermally conductively coupled through said insulating material to said solder connection such that upon application of said external electrical signal to said heater element means sufficient heat is generated to desolder said solder connection and thereby disconnect said circuit connection between said conductor pads;

wherein the improvement comprises said heater element means comprises two separate heater elements each receiving its own associated separate and independent external electrical signal and each generating heat in response thereto which is coupled through said material to said solder connection, wherein in response to the application of said external electrical signals to both of said heater elements said heater means provides sufficient heat to disconnect said circuit connection, the heat provided by any one of said heater elements being insufficient to desolder said solder connection and remove said circuit connection.

* * * * *

UNITED STATES PATENT AND TRADEMARK OFFICE
CERTIFICATE OF CORRECTION

PATENT NO. : 5,084,691

DATED : 1/28/92

INVENTOR(S) : Theodore V. Lester, Jerry Meyerhoff and Loren Saar

It is certified that error appears in the above-identified patent and that said Letters Patent is hereby corrected as shown below:

Column 6, line 36, insert prior to "insulating" --heater element means thermally conductively coupled through said--.

Column 7, line 25, delete "t" and insert --to--.

Column 8, line 28, insert after "thermally" the words --conductively coupled through said thermally--.

Signed and Sealed this

Twenty-seventh Day of April, 1993

Attest:

MICHAEL K. KIRK

Attesting Officer

Acting Commissioner of Patents and Trademarks